United States Patent
Murray et al.

(10) Patent No.: US 10,468,296 B2
(45) Date of Patent: Nov. 5, 2019

(54) REDUCING CONTACT RESISTANCE IN VIAS FOR COPPER INTERCONNECTS

(71) Applicant: INTERNATIONAL BUSINESS MACHINES CORPORATION, Armonk, NY (US)

(72) Inventors: Conal E. Murray, Yorktown Heights, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/782,421

(22) Filed: Oct. 12, 2017

(65) Prior Publication Data
US 2018/0033683 A1 Feb. 1, 2018

Related U.S. Application Data

(63) Continuation of application No. 14/730,581, filed on Jun. 4, 2015, now Pat. No. 10,170,358.

(51) Int. Cl.
*H01L 23/48* (2006.01)
*H01L 21/4763* (2006.01)
(Continued)

(52) U.S. Cl.
CPC .. *H01L 21/76805* (2013.01); *H01L 21/76816* (2013.01); *H01L 21/76831* (2013.01);
(Continued)

(58) Field of Classification Search
CPC ........... H01L 23/53295; H01L 23/5226; H01L 23/53228; H01L 21/76802; H01L 21/76832; H01L 21/76846; H01L 23/5283; H01L 21/76805; H01L 21/76816; H01L 21/76831; H01L 21/76843; H01L 21/76844; H01L 21/76879; H01L 23/528;
(Continued)

(56) References Cited

U.S. PATENT DOCUMENTS 5,891,513 A 4/1999 Dubin et al.
6,143,645 A 11/2000 Hsu et al.
(Continued)

OTHER PUBLICATIONS

Yang et al., Effects of Contact Area on Mechanical Strength, Electrical Resistance, and Electromigration Reliability of Cu/Low-k Interconnects, Electrochemical and Solid-State Letters, 13 (6) H197-H199, Mar. 31, 2010, pp. H197-H199.
(Continued)

*Primary Examiner* — Alonzo Chambliss
(74) *Attorney, Agent, or Firm* — Tutunjian & Bitetto, P.C.; Vazken Alexanian

(57) ABSTRACT

A method of forming an electrical transmission structure that includes forming an opening through an interlevel dielectric layer to expose at least one electrically conductive feature and forming a shield layer on the opening. A gouge is formed in the electrically conductive feature through the opening using a subtractive method during which the shield layer protects the interlevel dielectric layer from being damaged by the subtractive method. A contact is formed within the opening in electrical communication with the at least one electrically conductive feature.

20 Claims, 4 Drawing Sheets

(51) Int. Cl.
*H01L 21/768* (2006.01)
*H01L 23/522* (2006.01)
*H01L 23/528* (2006.01)
*H01L 23/532* (2006.01)

(52) U.S. Cl.
CPC .. *H01L 21/76843* (2013.01); *H01L 21/76844* (2013.01); *H01L 21/76846* (2013.01); *H01L 21/76879* (2013.01); *H01L 23/528* (2013.01); *H01L 23/5226* (2013.01); *H01L 23/53233* (2013.01); *H01L 23/53238* (2013.01)

(58) Field of Classification Search
CPC . H01L 23/53233; H01L 23/53238; C23F 4/00
See application file for complete search history.

(56) References Cited

U.S. PATENT DOCUMENTS

| | | | |
|---|---|---|---|
| 6,522,013 | B1 | 2/2003 | Chen et al. |
| 7,086,138 | B2 | 8/2006 | Anderson |
| 7,727,888 | B2 | 6/2010 | Yang et al. |
| 7,790,599 | B2 | 9/2010 | Yang et al. |
| 8,361,900 | B2 | 1/2013 | Pan et al. |
| 8,664,766 | B2 | 3/2014 | Yang et al. |
| 2002/0121699 | A1 | 9/2002 | Cheng et al. |
| 2002/0171147 | A1* | 11/2002 | Yew ............... H01L 21/76801 257/751 |
| 2003/0160331 | A1* | 8/2003 | Fujisawa ......... H01L 21/76805 257/774 |
| 2005/0118796 | A1* | 6/2005 | Chiras ............ H01L 21/76805 438/618 |
| 2005/0173799 | A1* | 8/2005 | Jou ................. H01L 21/76805 257/751 |
| 2006/0081986 | A1* | 4/2006 | Clevenger ....... H01L 21/76802 257/751 |
| 2007/0202689 | A1* | 8/2007 | Choi ............... H01L 21/76805 438/637 |
| 2009/0239062 | A1* | 9/2009 | Cotte ................. H01L 21/2885 428/332 |
| 2010/0176511 | A1* | 7/2010 | Maekawa ........ H01L 21/76805 257/751 |
| 2013/0001789 | A1* | 1/2013 | Yang ............... H01L 21/76814 257/769 |

OTHER PUBLICATIONS

List of IBM Patents or Patent Applications Treated as Related dated Oct. 12, 2017, 2 pages.

* cited by examiner

REDUCING CONTACT RESISTANCE IN VIAS FOR COPPER INTERCONNECTS

BACKGROUND

Technical Field

The present disclosure relates to interconnect devices and structures for transmitting electrical current.

Description of the Related Art

As the technology node advances in semiconductor devices, the dimensions of the semiconductor devices continue to decrease. As millions of devices and circuits are positioned onto a semiconductor chip, the wiring density and the number of metal levels are increased generation after generation. As interconnect dimensions continue to decrease, the contact resistance within the vias that allow power to flow between metallization levels represents a larger component to the overall resistance of the electrical device including the interconnects.

SUMMARY

In one embodiment, an interconnect structure is provided that may include an interlevel dielectric layer on an electrically conductive feature; and an opening present in the interlevel dielectric layer. The opening may include a first width at a first depth into the interlevel dielectric layer, and a second width at a second depth that is greater than the first depth, wherein the second width is less than the first width of the opening. The portion of the opening having the second width includes a portion of the opening that extending through the entirety of the interlevel dielectric layer into contact with the electrically conductive feature. A contact may be present extending through the opening into contact with the electrically conductive feature, wherein a gouge is present at the interface of the contact and the electrically conductive feature. A shield liner can be present on the vertical sidewalls of the opening between the interlevel dielectric layer and the contact.

In another aspect of the present disclosure, a method of forming an electrical transmission structures is provided. In one embodiment, the method of forming the electrical transmission structure includes forming an interlevel dielectric layer atop a substrate including at least one electrically conductive feature, and forming an opening through the interlevel dielectric layer to expose a portion of the at least one electrically conductive feature. A shield layer may then be formed on the opening. The shield layer can be formed using a non-conformal process to provide a greater thickness of shield material on horizontal surfaces of the opening in comparison to vertical surfaces of the opening. This can provide that the shield layer has a greater height adjacent to the vertical surfaces than a height of the shield layer atop the horizontal surfaces. A gouge may then be formed in the electrically conductive feature through the opening using a subtractive method. The shield layer protects the interlevel dielectric layer from being damaged by the subtractive method. A contact may be formed within the opening in electrical communication with the at least one electrically conductive feature.

In another embodiment, the method of forming the electrical transmission structure may include forming an opening through an interlevel dielectric layer to expose a portion of at least one electrically conductive feature that is present underlying the interlevel dielectric layer, and forming a shield layer on horizontal surfaces and vertical thickness on horizontal surfaces of the opening in comparison to the shield layer present on the vertical surfaces of the opening, which provides that the shield layer has a greater height adjacent to the vertical surfaces of the opening than the height of the shield layer atop the horizontal surfaces of the opening. In a following step, a gouge may be formed in the electrically conductive feature through the opening using an ion plasma method.

The ion plasma method removes a portion of an upper surface of the electrically conductive features, as well as the shielding present on the electrically conductive features. A contact may be formed within the opening in electrical communication with the at least one electrically conductive feature.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
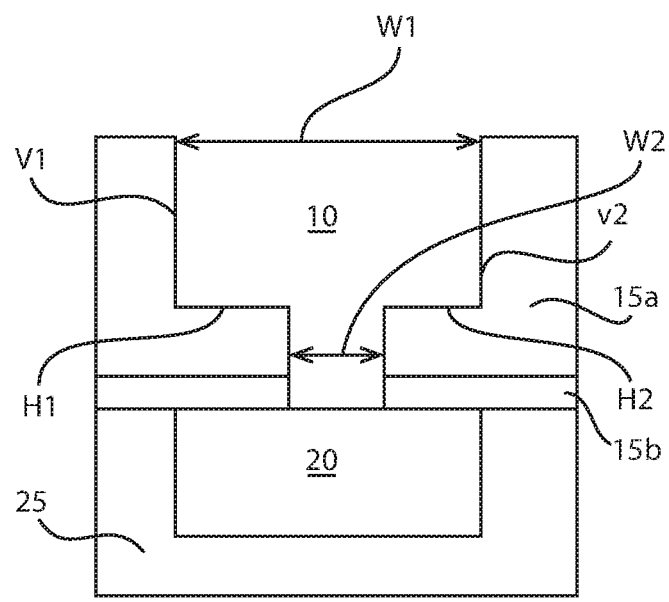
FIG. 1 is a side cross-sectional view depicting forming an opening through an interlevel dielectric layer to expose a portion of at least one electrically conductive feature that is present underlying the interlevel dielectric layer, in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms.

In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "present on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

As interconnect dimensions continue to decrease, the contact resistance within vias that allow power to flow between metallization levels represents a larger component to the overall resistance. In particular, it has been determined that the contact between the liner material at the via bottom and the underlying metallization can dominate the via resistance. In some examples, opening the underlying metallization, e.g., electrically conductive features, at the via bottom by forming a gouge creates a larger contact surface area that can lower resistance. However, this method of forming a gouge in the metallization at the via bottom can also damage the interlevel dielectric (ILD) surfaces that are exposed during this process. The resulting damaged ILD surfaces are also roughened, which can subsequently lead to poor liner material coverage. It has also been determined that using lower dielectric constant ILD materials cam exacerbate the above described issue.

In some embodiments, the methods and structures that are disclosed herein can create increased surface area at the bottom of metallization vias without damaging the exposed ILD surfaces. For example, in some embodiments, the methods and structures that are disclosed herein can employ a shield liner to protect the exposed ILD surfaces during etching of the underlying via bottom. The shield liner disclosed herein is compatible with current back-end-of-line (BEOL) processing and will result in better yield of interconnects with lower contact resistance. For example, the shield liner may be deposited on top of a conventional liner, e.g., metal nitride layer, such as a conformal tantalum nitride (TaN) or titanium nitride (TiN), after the ILD trench/via opening has been formed. In some embodiments, the shield liner is composed of insulating or conductive material, and is designed to be thinner at the via bottom than in the field region. Subsequent etching to further open the via can completely remove the shield liner at the via bottom but not on the other horizontal surfaces, which can protect them from being damaged during the etch steps for forming the gouge in the electrically conductive feature. Some embodiments of the methods and structures disclosed herein, are now described in more detail with reference to FIGS. 1-6.

FIG. 1 depicts forming an opening 10 through an interlevel dielectric layer 15a, 15b to expose a portion of at least one electrically conductive feature 20 that is present underlying the interlevel dielectric layer 15a, 15b. The term "electrically conductive feature" denotes a conductive structure that transmits an electrical signal, e.g., electrical current, from one portion of a device to at least a second portion of the device. The electrically conductive feature may provide for electrical communication in a horizontal direction, i.e., along a plane extending parallel to an upper surface of a device. In this manner, the electrically conductive feature may be a metal line and/or wiring.

The structure shown in FIG. 1 can be fabricated using interconnect techniques, which can include employing a wafer (not shown) including various semiconductor devices (not shown), and forming a first dielectric layer 25 atop the wafer. The first dielectric layer 25 can be composed of any dielectric material, including but not limited to, $SiO_2$, $Si_3N_4$, SiCOH, SiLK, porous dielectric, and combinations thereof. Embedded within first dielectric layer 25 is a first level of metal wiring, which is referred to hereafter as the electrically conductive feature 20. The electrically conductive feature 20 may be composed of any electrically conductive material. "Electrically conductive" as used through the present disclosure means a material typically having a room temperature conductivity of greater than $10^7(\Omega\text{-m})^{-1}$. Examples of electrically conductive materials that are suitable for the electrically conductive features include Cu, Al, Al(Cu), W and combinations thereof.

The first dielectric layer 25 may be formed on a substrate (not shown), such as a semiconductor or insulating substrate, using a deposition process, such as chemical vapor deposition, plasma enhanced chemical vapor deposition, chemical solution deposition, physical vapor deposition, and spin on deposition. Following formation of the first dielectric layer 25, the electrically conductive features 20 may be formed using photolithography, etching and deposition processes. For example, in some embodiments, a pattern is produced on the first dielectric layer 25 by applying a photoresist to the surface to be etched; exposing the photoresist to a pattern of radiation; and then developing the pattern into the photoresist utilizing resist developer. Once the patterning of the photoresist is completed, the sections of the first dielectric layer 25 that are covered by the photoresist are protected while the exposed regions are removed using a selective etching process that removes the unprotected regions. The etch process may be an anisotropic etch, such as reactive ion etch. After forming the trench, the photoresist mask may be removed using chemical stripping, selective etching or oxygen ashing. A conductive material may then be deposited in the trench to provide the electrically conductive features 20 using a deposition process, such as plating or sputtering. A planarization process, such as chemical mechanical planarization (CMP), may be employed so that an upper surface of the electrically conductive features 20 are coplanar with the upper surface of the first dielectric layer 25.

Still referring to FIG. 1, the interlevel dielectric layers 15a, 15b may then be formed over the electrically conductive features 20 and the first dielectric layer 25a. In one example, a capping layer 15b may be formed on the upper surface of the electrically conductive features 20 and the first dielectric layer 25. The capping layer 15b may be composed of a dielectric material, such as an oxide or nitride. For example, the capping layer 15b may be composed of a silicon nitride ($Si_3N_4$), silicon carbide (SiC), SiC(N,H) and combinations thereof. The capping layer 15b may be deposited using a deposition process, such as chemical vapor deposition (CVD). Examples of CVD that are suitable for forming the capping layer 15b include, but are not limited to, Atmospheric Pressure CVD (APCVD), Low Pressure CVD (LPCVD) and Plasma Enhanced CVD (EPCVD), Metal-Organic CVD (MOCVD) and combinations thereof. The thickness of the capping layer 15a may range from 10 nm to 25 nm.

A second dielectric layer 15a may then be formed on the capping layer 15b. The second dielectric layer 15a may be composed of any dielectric layer. For example, the second dielectric layer 15a may be composed of $SiO_2$, $Si_3N_4$, SiCOH, SiLK, and combinations thereof. In some examples, the second dielectric layer 15a may be composed of a low-k dielectric. The term "low-k" denotes a material having a dielectric constant that is less than silicon dioxide at room temperature (e.g., 25° C.). In one embodiment, a second dielectric layer 15a of a low-k dielectric has a dielectric constant that is less than 4.0, e.g., 3.9. In another embodiment, a second dielectric layer 15a of a low-k dielectric may have a dielectric constant ranging from 1.75 to 3.5. In yet another embodiment, a second dielectric layer 15a of a low-k dielectric may have a dielectric constant ranging from 2.0 to 3.2. Examples of materials suitable for a low-k dielectric that can provide the second dielectric layer 15a include organosilicate glass (OSG), fluorine doped silicon dioxide, carbon doped silicon dioxide, porous silicon dioxide, porous carbon doped silicon dioxide, spin-on organic polymeric dielectrics (e.g., SILK™), spin-on silicone based polymeric dielectric (e.g., hydrogen silsesquioxane (HSQ), undoped silica glass, diamond like carbon (DLC), methyl-silsesquioxane (MSQ) and combinations thereof.

Still referring to FIG. 1, an opening 10 may then be formed in the interlevel dielectric layers 15a, 15b. The opening 10 may be formed through the interlevel dielectric layers 15a, 15b to expose a portion of the at least one electrically conductive feature 20. In some embodiments, the opening 10 includes a first width W1 at a first depth into the interlevel dielectric layers 15a, and a second width W2 at a second depth into the interlevel dielectric layer 15a that is greater than the first depth. The second width W2 is equal to or less than the first width W1 of the opening 10, and includes a portion of the opening 10 that extending through the entirety of the interlevel dielectric layers 15a, 15b into contact with the electrically conductive feature 20. For example, the first width W1 may range from 5 nm to 200 nm, and the second width W2 may range from 5 nm to 200 nm. In another example, the first width W1 may range from 14 nm to 40 nm, and the second width W2 may range from 14 nm to 40 nm.

The opening 10 may be formed using deposition, photolithography and etch processes. In one embodiment, the opening 10 may be formed using a dual damascene process. The dual-damascene process is characterized by patterning the vias and trenches, in such a way that the metal deposition for forming the electrically conductive fill for the via and trench fills both at the same time. The interlevel dielectric layer 15a is patterned using lithography and etching techniques to form a via and trench. For example, in some embodiments, a pattern is produced on the interlevel dielectric layer 15a by applying a photoresist to the surface to be etched; exposing the photoresist to a pattern of radiation; and then developing the pattern into the photoresist utilizing resist developer. Once the patterning of the photoresist is completed, the sections of the interlevel dielectric layer 15a and the capping layer 15b that are covered by the photoresist are protected while the exposed regions are removed using a selective etching process that removes the unprotected regions. The etch process may be an anisotropic etch, such as reactive ion etch. In some embodiments, the etch process is a selective etch. As used herein, the term "selective" in reference to a material removal process denotes that the rate of material removal for a first material is greater than the rate of removal for at least another material of the structure to which the material removal process is being applied. For example, in some embodiments, the capping layer 15b may be removed by an etch chemistry that is selective to the electrically conductive feature 20. After forming the vias and trenches, the photoresist mask may be removed using chemical stripping, selective etching or oxygen ashing. The opening 10 may include horizontal surfaces H1, H2 and vertical surfaces V1, V2 as depicted in FIG. 1.

Figure 2:
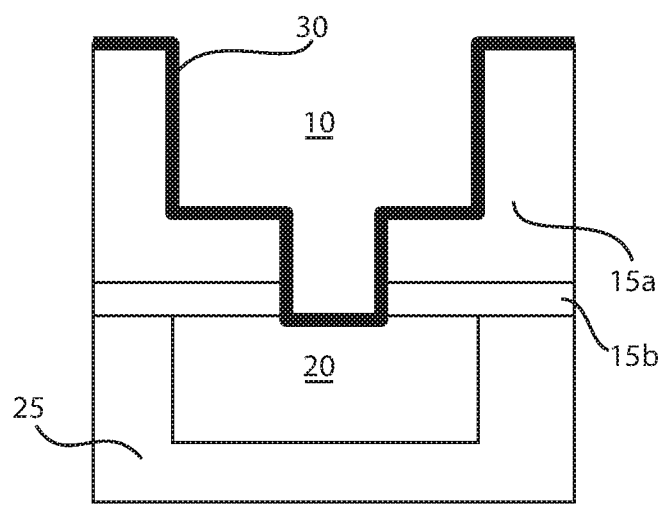
FIG. 2 is a side cross-sectional view depicting one embodiment of forming a liner layer on the horizontal and vertical surfaces of the opening depicted in FIG. 1.

FIG. 2 depicts one embodiment of forming a liner layer 30 on the horizontal H1, H2 and vertical surfaces V1, V2 of the opening 10 depicted in FIG. 1. In the embodiments in which the lines and interconnects formed within the opening are composed of copper (Cu), the liner layer 30 may be a tantalum (Ta) based layer. The liner layer 30 may also be composed of TaN, Ta, Ti, Ti(Si)N, Ru, W, Ir, $SiO_2$, $Si_3N_4$, SiC, SiC(N,H), and combinations thereof. In some embodiments, the liner layer 30 obstructs copper (Cu) atoms from migrating into the interlevel dielectric (ILD) layer 15a. In some embodiments, the liner layer 30 provides good adhesion for the subsequently deposited metal fill, such as copper metal fill. In yet other embodiments, the liner layer 30 may also function as an oxygen getter, seed layer and adhesion promoter. The liner layer 30 is typically deposited using a conformal deposition process. The term "conformal" denotes a layer having a thickness that does not deviate from greater than or less than 30% of an average value for the thickness of the layer. In some embodiments, the liner layer 30 may be deposited using chemical vapor deposition, such as plasma enhanced chemical vapor deposition (PECVD). In other embodiments, the liner layer 20 may be deposited using atomic layer deposition (ALD). The liner layer 30 may have a thickness ranging from 1 nm to 10 nm. In some embodiments, the liner layer 30 may be omitted.

Figure 3:
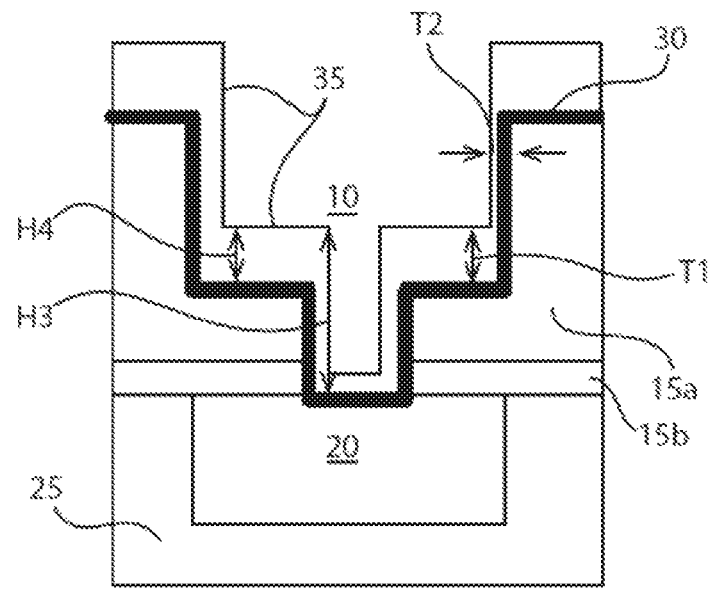
FIG. 3 is a side cross-sectional view depicting forming a shield layer on horizontal surfaces and vertical surfaces of the opening in the interlevel dielectric layer, in accordance with one embodiment of the present disclosure.

FIG. 3 depicts one embodiment of forming a shield layer 35 on horizontal surfaces H1, H2 and vertical surfaces V1, V2 of the opening 10 in the interlevel dielectric layers 15a, 15b. The shield layer 35 is formed with a non-conformal process to provide a greater thickness of shield material on horizontal surfaces of the opening in comparison to vertical surfaces of the opening 10. The term "non-conformal" denotes a layer having a thickness that does deviate from greater than 30% of an average value for the thickness of the layer. For example, the thickness T1 of the shield material that is present on the horizontal surfaces H1, H2 may range from 3 nm to 150 nm, and the thickness T2 of the shield material that is present on the vertical surfaces V1, V2 may range from 1 nm to 50 nm. In another example, the thickness T1 of the shield material that is present on the horizontal surfaces H1, H2 may range from 5 nm to 30 nm, and the thickness T2 of the shield material that is present on the vertical surfaces V1, V2 may range from 2 nm to 10 nm. The non-conformal deposition of the shield material for the shield layer 35 can provide that the shield layer 35 having a greater height H3, i.e., measured from the upper surface electrically conductive material 30, adjacent to the vertical surfaces V1, V2 of the opening 10 than a height H4 of the shield layer 35 atop the horizontal surfaces H1, H2 of the opening 10. In some embodiments, the portion of the shield layer that is present on the electrically conductive feature 20 may have a thickness that is less than the thickness of the shield layer 20 that is present on the horizontal surfaces H1, H2 of the interlevel dielectric layer 15b.

The shield layer 35 may be composed of electrically conductive or dielectric materials. For example, the shield layer 35 may be composed of silicon nitride, silicon oxide, silicon carbide, Ta(N), Ti(N) and combinations thereof. The shield layer 35 may be deposited by any non-conformal deposition process. For example, the shield layer 35 may be deposited using chemical vapor deposition processes, such as plasma enhanced chemical vapor deposition (PECVD) or physical vapor deposition (PVD), in which non-conformity of the deposition process may be provided by adjusting the deposition pressure or controlling the vacuum condition within the deposition chamber. In some embodiments, the liner layer 30 may be positioned between the shield layer 35 and the sidewalls of the opening 10 provided by the interlevel dielectric layer 15a, 15b, and the electrically conductive feature 20.

Figure 4:
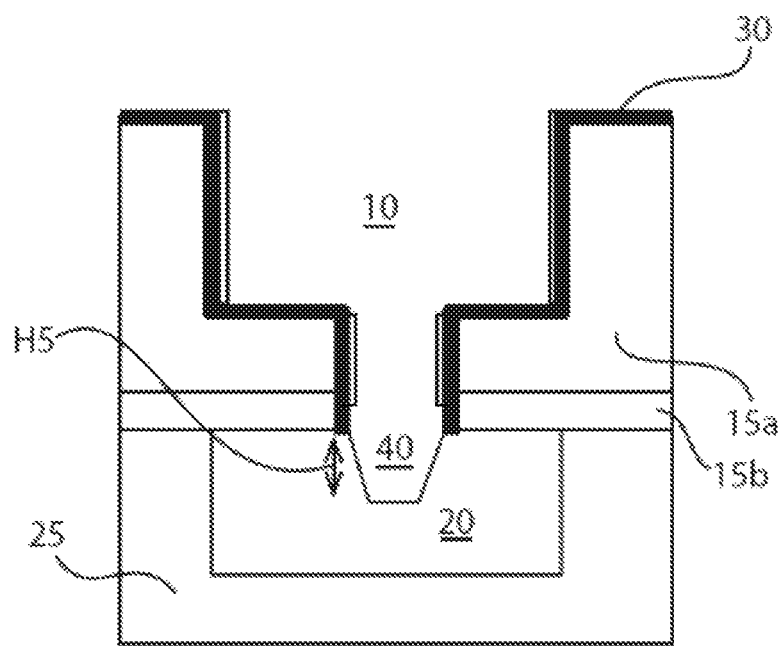
FIG. 4 is a side cross-sectional view depicting one embodiment of forming a gouge in the electrically conductive feature through the opening, in accordance with one embodiment of the present disclosure.

FIG. 4 depicts one embodiment of forming a gouge 40 in the electrically conductive feature 20 through the opening 10. In some embodiments, the gouge 40 in the electrically conductive feature 20 may be formed using a subtractive method. The term "subtractive method" denotes a process that removes material. Examples of subtractive methods may include etching, ion bombardment, laser ablation and combinations thereof. In one embodiment, the subtractive method includes bombardment of the structures within the opening 10 with a gaseous ion plasma. For example, the gaseous ion plasma may be composed of argon (Ar), helium (He), neon (Ne), xeon (Xe), nitrogen ($N_2$), hydrogen ($H_2$), ammonia ($NH_3$), diazene ($N_2H_2$) and combinations thereof. Typically, the gaseous ion plasma subtractive method is an anisotropic process. As used herein, an "anisotropic process" denotes a material removal process in which the material removal rate in the direction normal to the surface to be removed is greater than in the direction parallel to the surface to be removed.

In other examples, the subtractive method may be an anisotropic etch process, such as reactive ion etch. Reactive Ion Etching (RIE) is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present disclosure include ion beam etching, plasma etching or laser ablation.

Referring to FIG. 4, in some embodiments, the shield layer 35 protects the interlevel dielectric layer 15a, 15b from being damaged by the subtractive method. Further, because the shield layer 35 is present over the portion of the liner layer 30 that is present on the sidewalls of the opening 10, i.e., horizontal H1, H2 and vertical surfaces V1, V2, the shield layer 35 protects the liner layer 30 from being damaged by the subtractive method. The subtractive method is typically an anisotropic method. Therefore, the active elements of the subtractive method, e.g., plasma ions, that impact the horizontal upper surface of the electrically conductive feature 20 to form the gouge 40, also impact the horizontal surfaces H1, H2 of the opening 10, as well as any material that is present on the horizontal surfaces H1, H2 of the opening. If the shield layer 35 is not present, applying the subtractive method to the upper surface of the electrically conductive feature 20 would remove material not only from the electrically conductive features 20, but would also damage the horizontal surfaces H1, H2 of the interlevel dielectric layer 15a, 15b, as well as any material layer that was present on the horizontal surfaces H1, H2 of the interlevel dielectric layer 15a, 15b. The presence of the shield layer 35 protects the horizontal surfaces H1, H2 and the underlying structures from being damaged by the subtractive method that forms the gouge 40 in the electrically conductive features 20.

For example, the subtractive method is blanket applied to the entirety of the opening 10. The subtractive method removes material from the shield layer 35, in which the height H3 of the shield layer 35 adjacent to the vertical surfaces of the interlevel dielectric layer 15a, 15b is greater than the height H4 of the shield layer 35 on the horizontal surfaces of the interlevel dielectric layer. In some embodiments, the height H4 of the shield layer 35 on the horizontal surfaces H1, H2 may be greater than the height of the shield layer 35 on the electrically conductive features 20. In this embodiment, the subtractive method is continued until an entirety of the shield layer 35 is removed from the upper surface of the electrically conductive feature 20, and continues to form a gouge 40 in the upper surface of the electrically conductive feature 20. Because the height of the shield layer 35 on the horizontal surfaces H1, H2 of the opening 10 is greater than the height of the shield layer 35 on the upper surface of the electrically conductive feature 20, when the entirety of the shield layer 35 is removed from the upper surface of the electrically conductive feature, a portion of the shield layer 35 remains on the horizontal surfaces H1, H2 of the opening to protect those surfaces from being damaged by the subtractive method for forming the gouge 40. As the subtractive method continues to be applied in forming the gouge 40, the portion of the shield layer 35 that is present on the horizontal surfaces H1, H2 of the interlevel dielectric layer 35 may also be removed. In some embodiments, at the conclusion of forming the gouge 40 in the electrically conductive feature 20, the portions of the shield layer 35 in direct contact with the vertical surfaces V1, V2 of the interlevel dielectric layer 15a, 15b remain, since those portions of the shield layer 35 can have the greatest height H3.

In some embodiments, the gouge 40 may have a depth H5 into the electrically conductive feature 20 ranging from 1 nm to 200 nm. In other embodiments, the gouge 40 may have a depth H5 into the electrically conductive feature 20 ranging from 3 nm to 100 nm. The gouge 40 that is formed in the electrically conductive feature 20 increases the contact surface area of the interface between the electrically conductive feature 20 and the subsequently formed metal fill that is formed in the opening 10. Further, because the liner layer 30 is formed prior to the shield layer 35, the liner layer 30 is formed on an undamaged surface of the interlevel dielectric layers 15a, 15b, an is present in a continuous and conformal manner.

Figure 5A:
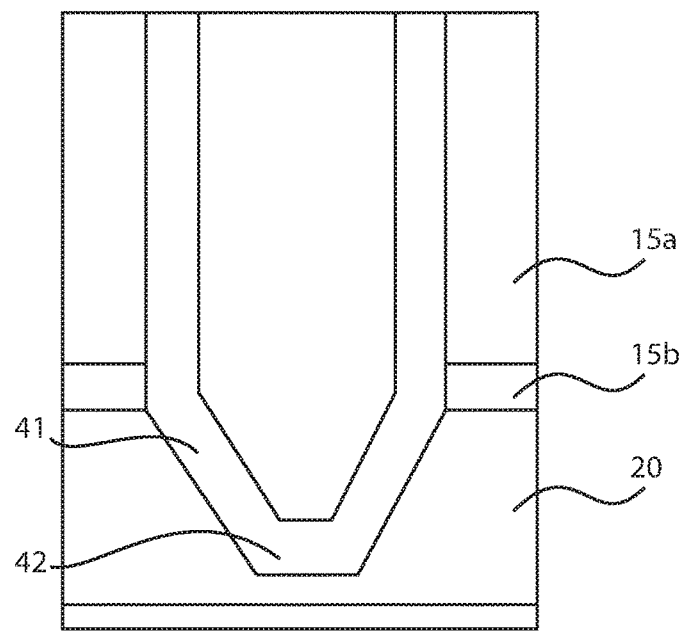
FIG. 5A is a side cross-sectional view of a gouge that is formed in the electrically conductive feature, in which the gouge includes angled sidewalls extending to a substantially planar base, in accordance with one embodiment of the present disclosure.
Figure 5B:
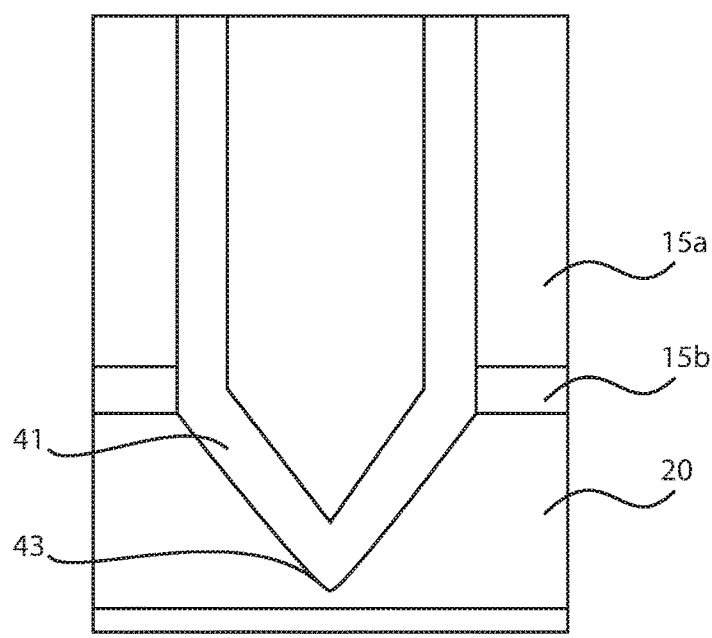
FIG. 5B is a side cross-sectional view of a gouge that is formed in the electrically conductive feature, in which the gouge includes angled sidewalls extending to an apex at a base of the gouge.

FIG. 5A depicts a gouge 40 that is formed in the electrically conductive feature 20, in which the gouge 40 includes angled sidewalls 41 extending to a substantially planar base 42. FIG. 5B depicts a gouge 40 that is formed in the electrically conductive feature 20, in which the gouge 40 includes angled sidewalls 41 extending to an apex 43 at a base of the gouge 40.

Figure 6:
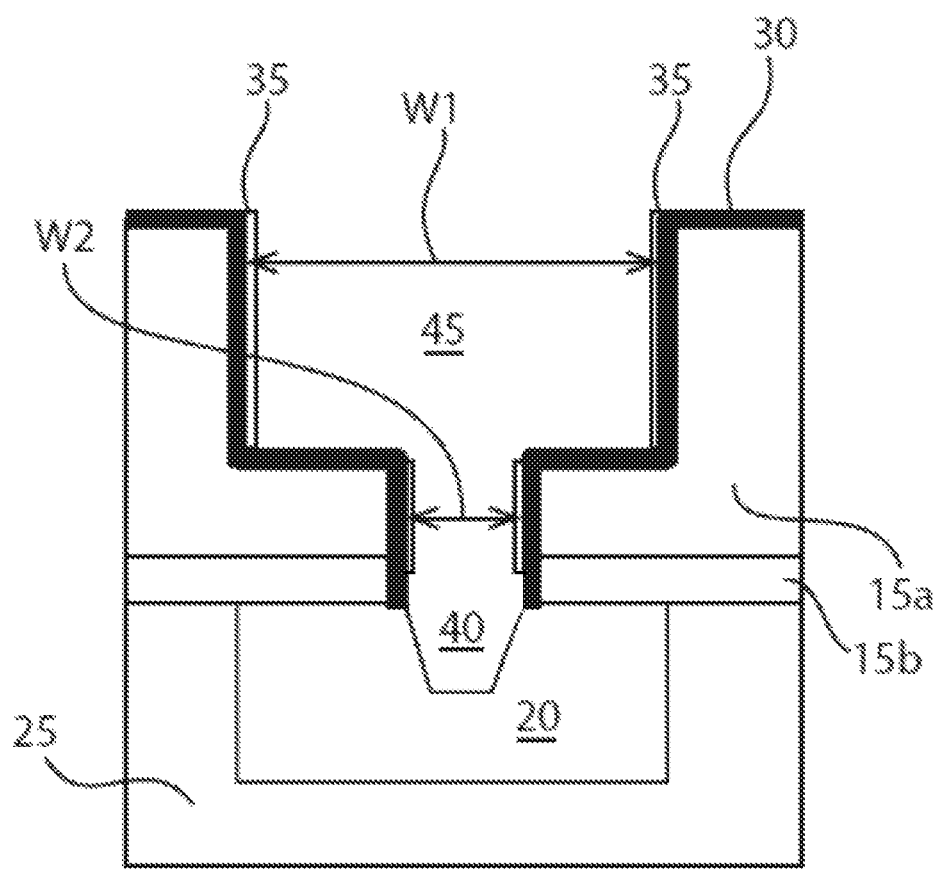
FIG. 6 is a side cross-sectional view depicting forming a contact within the opening in electrical communication with the at least one electrically conductive feature, in accordance with one embodiment of the present disclosure.

FIG. 6 depicts forming an interconnect contact 45 within the opening 10 in electrical communication with the at least one electrically conductive feature 20. The interconnect contact 45 may include a metal fill that also fills the gouge 40. In some embodiments the interconnect contact 45 may be composed of copper (Cu). In some embodiments forming the copper (Cu) fill to provide the electrically conductive feature may begin with a thin Cu seed that is deposited by physical vapor deposition (PVD) followed by the electroplating of Cu, which fills the via and trench portions of the opening 10. The excess Cu is removed by a chemical mechanical polishing process (CMP) and an etch stop layer (also called capping layer), typically SiN based, is deposited.

In one embodiment, the copper including material of the interconnect contact 45, i.e., including both metal lines and vias, is a pure copper, i.e., 100 at. % copper. The pure copper may include incidental oxidation of the copper. In another embodiment, the copper including material is a mixture of copper and one or more other metals. A copper-metal mixture can be a heterogeneous mixture, or alternatively, a homogeneous mixture, such as an alloy. Some alloys of copper include copper-tantalum, copper-manganese, copper-aluminum, copper-titanium, copper-platinum, copper-zinc, copper-nickel, and copper-silver alloys. Generally, the alloys considered herein contain copper in an amount of at least 40% by weight of the alloy, and more generally, at least 50%, 60%, 70%, 80%, 90%, 95%, 97%, 98%, or 99% by weight of the alloy. It is noted that any composition including copper may be employed for the copper including structure 20, so long as the composition is electrically conductive. It is noted that copper is only one material that is suitable for the interconnect contact 45, which includes the metal lines and vias, that are present in the interlevel dielectric layer 15a. Other metal including materials are equally suitable for the interconnect contact 45 including aluminum, platinum, silver, tungsten and combinations thereof.

Referring to FIG. 6, in some embodiments, an interconnect structure may be provided that includes an interlevel dielectric layer 15a, 15b that is present on an electrically conductive feature 20, in which an opening present 10 in the interlevel dielectric layer 15a, 15b. The opening 10 may include a first width W1 at a first depth into the interlevel dielectric layer 15a, 15b, and a second width W2 at a second depth that is greater than the first depth. The second width is less than the first width of the opening 10 and includes a portion of the opening that extending through the entirety of the interlevel dielectric layer 15a, 15b into contact with the electrically conductive feature 20. The contact, i.e., interconnect contact 45, is present extending through the opening 10 into contact with the electrically conductive feature 20. A gouge 40 is present at the interface of the contact, i.e., interconnect contact 45, and the electrically conductive feature 20. Further, a shield liner 35, i.e., remaining portions of the shield liner 35 from the process described herein, may be present on vertical sidewalls V1, V2 of the opening 10 between the interlevel dielectric layer 15b, and the contact 45. The horizontal surfaces H1, H2 of the opening 10 are not damaged by etch chemistries used to form the gouge 40 40. For example, plasma ions from the subtractive method described above for forming the gouge 40, are not present embedded within the horizontal surfaces H1, H2 of the opening 10.

In some examples, the electrically conductive feature is a metal line, and the opening to the electrically conductive feature through the interlevel dielectric layer 15a, 15b includes the via opening having a substantially circular or multi-sided cross section. The shield liner 35 can be a dielectric or electrically conductive material, and can have a thickness ranging from 3 nm to 150 nm. In some embodiments, the interconnect structure that is depicted in FIG. 1 further includes a conformal metal nitride layer, i.e., liner layer 30, present on vertical and horizontal surfaces of the opening, wherein the metal nitride layer is present between the shield liner 35 and the interlevel dielectric layer 15b.

The interconnect structure that is described above with reference to FIGS. 1-6 may be employed in any electrical device. For example, the interconnect structures that are disclosed herein may be present within electrical devices that employ semiconductors that are present within integrated circuit chips. The integrated circuit chips including the disclosed interconnects may be integrated with other chips, discrete circuit elements, and/or other signal processing devices as part of either (a) an intermediate product, such as a motherboard, or (b) an end product. The end product can be any product that includes integrated circuit chips, including computer products or devices having a display, a keyboard or other input device, and a central processor.

Having described preferred embodiments of a system and method of REDUCING CONTACT RESISTANCE IN VIAS FOR COPPER INTERCONNECTS, it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. An interconnect structure comprising:
   a contact present within an opening having at least two widths, wherein the contact extends into contact with an electrically conductive feature, wherein a gouge is present in an upper surface of the electrically conductive feature; and
   a shield liner present on the sidewalls of the opening, wherein the shield liner includes discontinuous segments on each end of opposed ends of the opening and is defined only outside of the gouge after the contact is deposited.

2. The interconnect structure of claim 1, wherein the electrically conductive feature is a metal line.

3. The interconnect structure of claim 1, wherein the opening has a substantially circular or multi-sided cross section.

4. The interconnect structure of claim 1, wherein the gouge includes angled sidewalls.

5. The interconnect structure of claim 1, wherein the gouge includes a planar base.

6. The interconnect structure of claim 1, wherein the gouge includes angled sidewalls.

7. The interconnect structure of claim 1, wherein the gouge includes an apex at a base of the gouge.

8. The interconnect structure of claim 1, wherein the shield liner is comprised of a dielectric material.

9. The interconnect structure of claim 1, wherein the shield liner is comprised of an electrically conductive material.

10. The interconnect structure of claim 1, wherein the shield liner has a thickness ranging from 3 nm to 150 nm.

11. The interconnect structure of claim 1, further comprising a conformal metal nitride layer present on vertical and horizontal surfaces of the opening.

12. The interconnect structure of claim 1, wherein the conformal metal nitride layer is present between the shield liner and an interlevel dielectric.

13. An interconnect structure comprising:
    a contact present within an opening having at least two widths, wherein the contact extends into contact with an electrically conductive feature, wherein a gouge is present in an upper surface of the electrically conductive feature;
    a metal nitride layer present on the sidewalls of the opening; and
    a shield liner present on the metal nitride layer that is present on the sidewalls of the opening, wherein the shield liner includes discontinuous segments on each end of opposed ends of the opening and is defined only outside of the gouge after the contact is deposited.

14. The interconnect structure of claim 13, wherein the electrically conductive feature is a metal line.

15. The interconnect structure of claim 13, wherein the opening has a substantially circular or multi-sided cross section.

16. The interconnect structure of claim 13, wherein the gouge includes angled sidewalls.

17. The interconnect structure of claim 13, wherein the gouge includes a planar base.

18. The interconnect structure of claim 13, wherein the gouge includes angled sidewalls.

19. The interconnect structure of claim 13, wherein the gouge includes an apex at a base of the gouge.

20. The interconnect structure of claim 13, wherein the shield liner is comprised of a dielectric material or is comprised of an electrically conductive material.

* * * * *